(12) United States Patent
Meador et al.

(10) Patent No.: US 6,576,408 B2
(45) Date of Patent: Jun. 10, 2003

(54) THERMOSETTING ANTI-REFLECTIVE COATINGS COMPRISING ARYL URETHANES OF HYDROXYPROPYL CELLULOSE

(75) Inventors: James D. Meador, Ballwin, MO (US); Mandar R. Bhave, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 103 days.

(21) Appl. No.: 09/798,178

(22) Filed: Mar. 2, 2001

(65) Prior Publication Data

US 2001/0031428 A1 Oct. 18, 2001

(51) Int. Cl.[7] ................................. G03F 7/30
(52) U.S. Cl. ................... 430/325; 430/271.1; 524/589; 524/590
(58) Field of Search ....................... 549/200; 430/271.1, 430/325; 526/238.21; 522/88; 524/589, 590

(56) References Cited

U.S. PATENT DOCUMENTS

| | | |
|---|---|---|
| 3,491,037 A | 1/1970 | Keys et al. |
| 3,661,619 A | 5/1972 | Surland |
| 4,007,144 A | 2/1977 | Sanders et al. |
| 4,133,783 A | 1/1979 | Brewer et al. |
| 4,401,749 A * | 8/1983 | Hoffmann et al. ........... 430/271 |
| 4,656,202 A | 4/1987 | Nason et al. |
| 4,780,228 A | 10/1988 | Gardiner et al. |
| 4,855,184 A | 8/1989 | Klun et al. |
| 4,861,629 A | 8/1989 | Nahm |
| 4,910,122 A | 3/1990 | Arnold et al. |
| 5,010,155 A * | 4/1991 | Mueller ....................... 527/301 |
| 5,094,765 A | 3/1992 | DeRosa et al. |
| 5,118,658 A * | 6/1992 | Egashira et al. ............. 503/227 |
| 5,140,086 A | 8/1992 | Hunter et al. |
| 5,157,093 A * | 10/1992 | Harishiades et al. ........ 527/301 |
| 5,234,990 A | 8/1993 | Flaim et al. |
| 5,294,680 A | 3/1994 | Knors et al. |
| 5,324,777 A * | 6/1994 | Buysch et al. .............. 525/54.3 |
| 5,382,495 A | 1/1995 | Niziolek et al. |
| 5,401,614 A | 3/1995 | Dichiara et al. |
| 5,421,618 A | 6/1995 | Okazaki et al. |
| 5,482,817 A | 1/1996 | Dichiara et al. |
| 5,554,485 A | 9/1996 | Dichiara et al. |
| 5,578,676 A | 11/1996 | Flaim et al. |
| 5,597,868 A | 1/1997 | Kunz |
| 5,607,824 A | 3/1997 | Fahey et al. |
| 5,641,854 A | 6/1997 | Jones et al. |
| 5,652,297 A | 7/1997 | McCulloch et al. |
| 5,654,376 A | 8/1997 | Knors et al. |
| 5,674,648 A | 10/1997 | Brewer et al. |
| 5,688,987 A | 11/1997 | Meador et al. |
| 5,693,691 A | 12/1997 | Flaim et al. |
| 5,851,738 A | 12/1998 | Thackeray et al. |
| 6,403,787 B2 * | 6/2002 | Engelhardt et al. ........... 536/56 |

FOREIGN PATENT DOCUMENTS

| | | |
|---|---|---|
| EP | 0542008 | 10/1992 |
| EP | 0636941 | 7/1994 |
| EP | 0917002 | 5/1999 |

OTHER PUBLICATIONS

Engelhardt et al., patent application publication US 2001/0007027 A1, Jul. 2001.*
J. Electrochem. Soc., "Solid State Science and Technology" Jan. 1982, p. 206.

* cited by examiner

Primary Examiner—Rosemary Ashton
(74) Attorney, Agent, or Firm—Howrey Williams LLP

(57) ABSTRACT

New polymers and anti-reflective compositions including those polymers are provided. The polymer comprises recurring monomers according to the formula

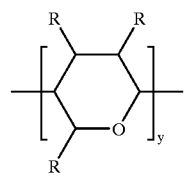

wherein each R is —OH, —CH$_2$OH, —O—R$^1$—O—X, or —CH$_2$—O—R$^1$—O—X, each R$^1$ is a branched or unbranched alkyl group, and each X is shown below. The inventive compositions can be used to form anti-reflective coatings having high etch rate and optical densities.

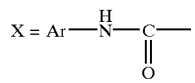

27 Claims, No Drawings

THERMOSETTING ANTI-REFLECTIVE COATINGS COMPRISING ARYL URETHANES OF HYDROXYPROPYL CELLULOSE

BACKGROUND OF THE INVENTION

1. Field of the Invention

The present invention is concerned with new polymers which can be used to form anti-reflective compositions for use in the manufacture of microelectronic devices. The polymers comprise hydroxyalkyl cellulose reacted with an aryl isocyanate.

2. Description of the Prior Art

Integrated circuit manufacturers are consistently seeking to maximize substrate wafer sizes and minimize device feature dimensions in order to improve yield, reduce unit case, and increase on-chip computing power. Device feature sizes on silicon or other chips are now submicron in size with the advent of advanced deep ultraviolet (DUV) microlithographic processes.

However, a frequent problem encountered by photoresists during the manufacturing of semiconductor devices is that activating radiation is reflected back into the photoresist by the substrate on which it is supported. Such reflectivity tends to cause blurred patterns which degrade the resolution of the photoresist. Degradation of the image in the processed photoresist is particularly problematic when the substrate is non-planar and/or highly reflective. One approach to address this problem is the use of an anti-reflective coating (ARC) applied to the substrate beneath the photoresist layer.

Compositions which have high optical density at the typical exposure wavelengths have been used for some time to form these ARC layers. The ARC compositions typically consist of an organic polymer which provides coating properties and a dye for absorbing light. The dye is either blended into the composition or chemically bonded to the polymer. Thermosetting ARCs contain a cross-linking agent in addition to the polymer and dye. Cross-linking must be initiated, and this is typically accomplished by an acid catalyst present in the composition.

While these ARCs are effective at lessening the amount of light reflected back into the photoresist, most prior art ARC compositions are lacking in that they do not have a sufficiently high etch rate. As a result, prior art ARCs present significant limitations which make them difficult or impossible to use on submicron (e.g., 0.3 $\mu$m) features. Accordingly, there is a need for improved ARCs which can be effectively utilized to form integrated circuits having submicron features while absorbing light at the wavelength of interest.

SUMMARY OF THE INVENTION

The present invention broadly comprises new polymers for use in forming anti-reflective compositions that are useful for the manufacture of microelectronic devices. These new polymers comprise a hydroxyalkyl cellulose reacted with an aryl isocyanate.

In more detail, the polymers comprise a moiety according to the formula:

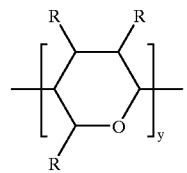

wherein each R is individually selected from the group consisting of —OH, —CH$_2$OH, —O—R$^1$—O—X, and —CH$_2$—O—R$^1$—O—X. Preferably, at least one of the R's is —O—R$^1$—O—X or —CH$_2$—O—R$^1$—O—X. Each R$^1$ is individually selected from the group consisting of branched and unbranched, substituted and unsubstituted alkyl groups (preferably C$_1$-C$_8$, and more preferably C$_1$-C$_4$), and each X has the formula

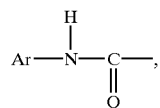

where Ar is selected from the group consisting of substituted and unsubstituted aryl (preferably C$_6$-C$_{12}$) groups. The most preferred aryl groups include phenyls, benzyls, 2-methoxy phenyls, and 2-nitrophenyls.

Preferably, the polymer comprises from about 41–66% by weight, and preferably from about 47–58% by weight of this isocyanate monomer, based upon the total weight of the polymer taken as 100% by weight.

The inventive polymers are formed by reacting a hydroxyalkyl cellulose polymer with an aryl isocyanate in a solvent system. Preferred such solvent systems include a solvent selected from the group consisting of propylene glycol methyl ether acetate (PGMEA), propylene glycol methyl ether (PGME), propylene glycol n-propyl ether, 2-heptanone, N-methylpyrollidinone, and mixtures thereof. Preferably the reaction is carried out for a time period of from about 2–24 hours (and more preferably about four hours), and at a temperature of from about 55–145° C. (and more preferably from about 80–120° C.).

Reacting the hydroxyalkyl cellulose polymer and aryl isocyanate under these conditions causes the carbon atom of the C=O group of the isocyanate to bond to an —OH group of the cellulose polymer so as to yield a urethane linkage therebetween. Furthermore, carrying out the reaction in the presence of an excess amount of isocyanate will cause at least some of the isocyanate groups to react with at least some of the urethane linkages. It will be appreciated that this method of forming the polymer is particularly advantageous in that the entire reaction can be carried out within a single reaction vessel. That is, there is no need to isolate any intermediate compounds during this reaction.

The inventive polymers can then be used to prepare anti-reflective compositions by dissolving the polymer in a suitable solvent system. The solvent system should have a boiling point of from about 118–202° C., and preferably from about 118–160° C. The amount of polymer dissolved in the solvent system is from about 7.5–20% by weight polymer, and preferably from about 9–15% by weight polymer, based upon the total weight of the composition taken as 100% by weight. The solvent system should be utilized at a level of from about 80–92.5% by weight, and preferably from about 85–91% by weight, based upon the total weight of the composition taken as 100% by weight. Preferred solvent systems include a solvent selected from the group consisting of PGMEA, 2-heptanone, N-methylpyrollidinone, and mixtures thereof.

Preferably, the inventive compositions further comprise a crosslinking agent and a catalyst. The crosslinking agent can be separate from the polymer or, alternately, the polymer can include "built-in" crosslinking moieties. Preferred crosslinking agents include aminoplasts (e.g., Powderlink® 1174, Cymel® 303LF). The crosslinking agent or moieties should be present in the composition at a level of from about 0.25–1.40% by weight, and preferably from about 0.3–1.2% by weight, based upon the total weight of the composition taken as 100% by weight. Thus, the compositions of the invention should crosslink at a temperature of from about 125–225° C., and more preferably from about 150–205° C.

Preferred catalysts include those selected from the group consisting of p-toluenesulfonic acid, pyridinium tosylate, 4,4'-sulfonyldiphenol, and mixtures thereof. The catalyst should be present in the composition at a level of from about 0.025–0.20% by weight, and preferably from about 0.03–0.15% by weight, based upon the total weight of the composition taken as 100% by weight.

The resulting ARC composition is subsequently applied to the surface of a substrate (e.g., silicon wafer) by conventional methods, such as by spin-coating, to form an anti-reflective coating layer on the substrate. The substrate and layer combination is baked at temperatures of at least about 150° C. The baked layer will generally have a thickness of anywhere from about 250 Å to about 1500 Å. Next, a photoresist can be applied to the ARC layer followed by exposing the photoresist to light at the desired wavelength, developing the exposed photoresist layer, and etching the developed photoresist layer all according to known procedures.

ARCs according to the invention have a high etch rate. Thus, the ARCs have an etch selectivity to resist (i.e., the ARC etch rate divided by the photoresist etch rate) of at least about 1.0, and preferably at least about 1.2, when $HBr/O_2$ is used as the etchant. Additionally, at 193 nm the inventive ARCs have a k value (i.e., the imaginary component of the complex index of refraction) of at least about 0.3, and preferably at least about 0.35, and have an n value (i.e., the ratio of the speed of light through a vacuum to the speed of light through the particular material) of at least about 1.5, and preferably at least about 1.6. That is, a cured layer formed from the inventive composition will absorb at least about 96%, and preferably at least about 99% of light at a wavelength of 193 nm. Furthermore, when subjected to a stripping test as defined herein, the inventive ARCs will have a stripping amount of less than about 10 Å, and preferably less than about 5 Å.

DETAILED DESCRIPTION OF THE PREFERRED EMBODIMENTS

EXAMPLES

The following examples set forth preferred methods in accordance with the invention. It is to be understood, however, that these examples are provided by way of illustration and nothing therein should be taken as a limitation upon the overall scope of the invention.

Example 1

A. Addition of Phenyl Isocyanate to Hydroxypropyl Cellulose

A 250 mL three-necked flask was equipped with a magnetic stirring bar, a thermometer, a nitrogen inlet, and a condenser with a nitrogen outlet. The flask was charged with 5.0 g (39.8 meq hydroxyl) of hydroxypropyl cellulose (obtained from Aldrich, 43,500-7) and 88.2 g of propylene glycol methyl ether acetate (PGMEA). The mixture was heated to about 100° C. for one hour under nitrogen with stirring, then allowed to cool to ambient temperature. The mixture was then stirred at ambient temperature and under nitrogen while adding 4.72 g (39.6 mmol) of phenyl isocyanate. The mixture was stirred for one hour at ambient temperature, 2½ hours at 60° C. temperature, 2½ hours at 100° C. The resulting mother liquor contained 10% solids.

B. Preparation of Anti-Reflective Coating

About 30 g (3.0 g polymer) of the polymer solution prepared in Part A of this example, 62.5 g of propylene glycol monomethyl ether (PGME), 0.66 g (6.15 meq) of an aminoplast (Powderlink® 1174, obtained from Cytec), and 66 mg of a catalyst (p-toluenesulfonic acid monohydrate) were stirred to yield the anti-reflective coating composition.

After deionization with PGME-washed 650C beads and a filtration, the composition was spin-coated onto a silicon wafer at 2500 rpm for 60 seconds followed by curing at 205° C. for 60 seconds with hotplate vacuum to yield an anti-reflective film having an average film thickness of 1345.6 Å.

The optical density of the film at 193 nm was 10.0/$\mu$m, and the average absorbance was 1.3533. The k value of the film was 0.39, while the n value was 1.67. The etch selectivity (determined using a LAM TCP instrument and $HBr/O_2$ (60/40) as the etchant) to Sumitomo's PAR 101 193 nm photoresist was 1.2. Good 0.14 $\mu$m features were observed using this photoresist.

The resistance of the film to solvents was determined by puddling a solvent (ethyl lactate) onto the film for 5–10 seconds, followed by spin drying at 5000 rpm for 30 seconds to remove the solvent. The film was then baked on a hotplate at 100° C. for 30 seconds. The film thickness was measured at multiple points on the wafer using ellipsometry. The amount of stripping was determined to be the difference between the initial and final average film thickness. In this example, the final average film thickness was 1340 Å, giving a stripping amount of −0.427 Å. After stripping, the average absorbance was 1.4386, and the optical density was 10.7/$\mu$m at 193 nmn.

Example 2

A. Addition of Phenyl Isocyanate to Hydroxypropyl Cellulose

In this procedure, 5.00 g (39.8 meq) of hydroxypropyl cellulose (obtained from Aldrich 43,500-7) and 104.7 g of PGMEA were added to a 500 mL three-necked flask equipped with a magnetic stirring bar, thermometer, nitrogen inlet, and condenser with nitrogen outlet. The mixture was purged with nitrogen for five minutes at ambient conditions, and then heated under nitrogen at an oil bath temperature of 98.5° C. to achieve a cloudy solution. The product was then allowed to cool to ambient conditions. About 6.65 g (55.8 meq) of phenyl isocyanate was added, and the mixture was stirred under nitrogen for four hours at about 100°. The yield was 112.7 g (96.9% recovery).

B. Preparation of Anti-Reflective Coating (Pyridinium Tosylate as Catalyst)

About 35.0 g (3.50 g polymer, 11.97 meq urethane, 31.5 g PGMEA) of the polymer solution prepared in Part A of this example, 6.7 g of PGMEA, 88.9 g PGME, and 1.28 g (11.94 meq) Powderlink® 1174 were stirred at ambient conditions to give a homogeneous solution. The product was deionized by tumbling with 6.6 g of PGME-washed 650C beads for four hours. The beads were removed by straining through two layers of plastic cloth, after which the solution was filtered through an end-point into a 250 mL Nalgene bottle.

Pyridinium tosylate (169 mg, 0.672 meq) was added as a catalyst, and the anti-reflective coating composition was stirred to homogeneity.

C. Properties of Anti-Reflective Coating

The coating prepared in Part B of this example was spin-coated onto a silicon wafer at 2500 rpm for 60 seconds followed by curing at 205° C. for 60 seconds with vacuum. The resulting film had a thickness of 1022 Å, and exhibited no (+2.54% thickness) ethyl lactate stripping. The optical density at 193 nm was 10.4/$\mu$m. The product gave off smoke during the bake step.

Next, the etch selectivity was determined utilizing a LAM TCP instrument and HBr/$O_2$ as the etch gas. The anti-reflective coating's selectivity to Sumitomo's photoresist PAR 101 was 1.0 to 1.

D. Preparation of Anti-Reflective Coating (p-toluenesulfonic Acid Monohydrate as Catalyst)

About 35.0 g (3.50 g polymer, 11.97 meq urethane, 31.5 g PGMEA) of the polymer solution prepared in Part A of this example, 6.3 g of PGMEA, 88.3 g PGME, 1.28 g (11.94 meq) Powderlink® 1174, and 128.2 mg of p-toluenesulfonic acid monohydrate were stirred at ambient conditions to give a homogeneous product. The product was deionized with 6.55 g of PGME-washed 650C beads by tumbling for four hours. The beads were removed by straining through two layers of plastic cloth, after which the solution was filtered through end-points (0.2 $\mu$m final).

E. Properties of Part D Anti-Reflective Coating

The coating composition prepared in Part D of this example was spin-coated onto a silicon wafer at 2500 rpm for 60 seconds followed by curing at 205° C. for 60 seconds with hotplate vacuum. The resulting film had a thickness of 1192 Å, and exhibited no (+1.10% thickness) ethyl lactate film stripping. The optical density at 193 nm was 9.56/$\mu$m. The product gave off smoke during the bake step.

Next, the etch selectivity was determined utilizing a LAM TCP instrument and HBr/$O_2$ as the etch gas. The anti-reflective coating's selectivity to Sumitomo's photoresist PAR 101 was 1.1.

Example 3

A. Addition of Benzyl Isocyanate to Hydroxypropyl Cellulose

In this procedure, 5.00 g (39.8 meq) of hydroxypropyl cellulose (obtained from Aldrich 43,500-7) and 93.3 g of PGMEA were charged in a 250 mL three-necked flask equipped with a magnetic stirring bar, thermometer, nitrogen inlet, and condenser with nitrogen outlet. The mixture was stirred under nitrogen at a temperature of 99.5–100° C. for 1.1 hours giving a slightly hazy solution. Upon standing at ambient conditions overnight, finely divided polymer re-precipitated. About 5.01 g (37.6 meq) of benzyl isocyanate was added with the mixture under nitrogen. The mixture was then stirred at ambient conditions for 1.0 hours. The temperature was raised to 57–59° C. for 2.6 hours, and then to 95–100.5° C. for 3.0 hours. The urethane reaction product was a hazy solution, with a yield of 102.2 g (98.9% recovery).

B. Preparation of Anti-Reflective Coating

About 51.6 g (5.00 g solids, 19.8 meq hydroxyl or urethane function, 46.6 g PGMEA) of the solution prepared in Part A of this example, 101.4 g of PGME, 1.06 g (9.86 meq) Powderlink® 1174, and 106 mg of p-toluenesulfonic acid monohydrate were stirred to give a homogeneous solution. The coating was deionized with 7.7 g of PGME-washed 650C beads by tumbling for four hours at ambient conditions. The beads were removed by straining through two layers of plastic cloth, after which the solution was filtered through an end-point.

C. Properties of Anti-Reflective Coating

The coating composition prepared in Part B of this example was spin-coated onto a silicon wafer at 2500 rpm for 60 seconds followed by curing at 205° C. for 60 seconds with vacuum. The resulting film had a thickness of 1130.3 Å, and exhibited minimal (–0.6 Å of thickness) ethyl lactate stripping. The optical density at 193 nm was 9.29/$\mu$m. The product gave off smoke during the bake step.

Example 4

A. Addition of 2-Methoxyphenyl Isocyanate to Hydroxypropyl Cellulose

In this procedure, 5.00 g (39.8 meq) of hydroxypropyl cellulose (obtained from Aldrich 43,500-7) and 98.5 g of PGMEA were charged in a 250 mL three-necked flask equipped with a magnetic stirring bar, thermometer, nitrogen inlet, and condenser with nitrogen outlet. The mixture was purged with nitrogen for 10 minutes at ambient conditions. The solution was then stirred under nitrogen at a temperature of about 104° C., and then allowed to cool. With the mixture temperature at 32° C., 5.94 g (39.8 mmol) of 2-methoxyphenyl isocyanate was added. The reaction mixture was stirred under nitrogen for four hours at 102° C. The weight of the final product was 109.4 g (98.7% recovery).

B. Preparation of Anti-Reflective Coating

About 50.0 g (5.0 g polymer, 18.2 meq urethane function, 45.0 g PGMEA) of the polymer solution prepared in Part A of this example, 46.8 g of PGMEA, 91.8 g of ethyl lactate, 1.96 g (18.2 meq) Powderlink® 1174, and 196 mg of p-toluenesulfonic acid monohydrate were stirred to give a solution. The product was deionized with 9.5 g of PGME-washed 650C beads by tumbling for four hours at ambient conditions. The beads were removed by straining through two layers of plastic cloth, after which the solution was filtered through a 0.2/0.45 $\mu$m end-point.

C. Properties of Anti-Reflective Coating

The coating composition prepared in Part B of this example was spin-coated onto a silicon wafer at 2500 rpm for 60 seconds followed by curing at 205° C. for 60 seconds with vacuum. The coating quality of the composition was good. The resulting film had a thickness of 833.5 Å, and exhibited no (+0.73 Å of thickness and +2.46% absorbance) ethyl lactate stripping. The optical density at 193 nm was 7.44/$\mu$m. The product gave off smoke during the bake step.

Next, the etch selectivity was determined utilizing a LAM TCP instrument and HBr/$O_2$ as the etch gas. The anti-reflective coating's selectivity to Sumitomo's 193-nm photoresist PAR 101 was 1.2.

Example 5

A. Addition of 2-Nitrophenyl Isocyanate to Hydroxypropyl Cellulose

In this procedure, 5.00 g (39.8 meq) of hydroxypropyl cellulose (obtained from Aldrich 43,500-7) and 104.0 g of PGMEA were charged in a 250 mL three-necked flask equipped with a magnetic stirring bar, thermometer, nitrogen inlet, and condenser with nitrogen outlet. The mixture was stirred under nitrogen for 30 minutes at about 100° C. and then allowed to cool to ambient conditions. About 6.53 g (39.8 meq) of 2-nitrophenyl isocyanate was added, and the mixture was stirred under nitrogen at 95–100° C. for 4.5 hours. The weight of the final product was 114.4 g (99.0% recovery).

B. Preparation of Anti-Reflective Coating

About 50.0 g (5.0 g polymer, 17.25 meq urethane function, 45.0 g PGMEA) of the nitrophenyl urethane solution prepared in Part A of this example, 27.9 g of PGMEA, 72.9 g of ethyl lactate, 0.62 g (5.77 meq) Powderlink® 1174, and 62.0 mg of p-toluenesulfonic acid monohydrate were stirred at ambient conditions to give a solution. The product was deionized with 7.6 g of PGME-washed 650C beads by tumbling for four hours. The beads were removed by straining through two layers of plastic cloth, after which the solution was filtered through an end-point.

C. Properties of Anti-Reflective Coating

The coating composition prepared in Part B of this example was spin-coated onto a silicon wafer at 2500 rpm for 60 seconds followed by curing at 205° C. for 60 seconds with hotplate vacuum. The resulting film had a thickness of 846 Å, and exhibited no ethyl lactate stripping. The optical density at 193 nm was 8.69/λm. The product gave off smoke during the hotplate bake. Under a microscope, the coat quality was rough, with an orange peel appearance.

Next, the etch selectivity was determined utilizing a LAM TCP instrument and $HBr/O_2$ as the etch gas. The anti-reflective coating's selectivity to Sumitomo's 193-nm photoresist PAR 101 was 1.2.

We claim:

1. In an anti-reflective composition for protecting a base material or holes formed in a base material, the composition including a polymer dissolved in a solvent system, the improvement which comprises said polymer comprising a hydroxyalkyl cellulose reacted with an aryl isocyanate.

2. The composition of claim 1, said composition comprising recurring monomers according to the formula

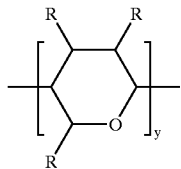

wherein each R is individually selected from the group consisting of —OH, —CH$_2$OH, —O—R$^1$—O—X, and —CH$_2$—O—R$^1$—O—X, with at least one of said R's being —O—R$^1$—O—X or —CH$_2$—O—R$^1$—O—X, and wherein each R$^1$ is individually selected from the group consisting of branched and unbranched alkyl groups, and each X has the formula

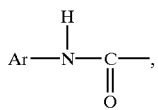

where Ar is an aryl group.

3. The composition of claim 2, wherein at least one R$^1$ is selected from the group consisting of C$_1$-C$_8$ alkyl groups.

4. The composition of claim 3, wherein at least one R$^1$ is selected from the group consisting of ethyl and propyl groups.

5. The composition of claim 2, wherein said polymer comprises from about 41–66% by weight of said monomer, based upon the total weight of the polymer taken as 100% by weight.

6. The composition of claim 1, wherein said aryl isocyanate is selected from the group consisting of C$_6$-C$_{12}$ aryl isocyanates.

7. The composition of claim 6, wherein said aryl isocyanate is selected from the group consisting of phenyl isocyanates, benzyl isocyanates, 2-methoxy phenyl isocyanates, and 2-nitrophenyl isocyanates.

8. The composition of claim 1, wherein said solvent system includes a solvent selected from the group consisting of PGMEA, 2-heptanone, propylene glycol n-propyl ether, PGME, N-methylpyrollidinone, and mixtures thereof.

9. The composition of claim 1, wherein said solvent system has a boiling point of from about 118–202° C.

10. The composition of claim 1, said composition further comprising a compound selected from the group consisting of cross-linking agents, catalysts, light attenuating compounds, and mixtures thereof.

11. The composition of claim 10, wherein said compound is an aminoplast cross-linking agent.

12. The composition of claim 10, wherein said compound is a catalyst selected from the group consisting of p-toluenesulfonic acid, pyridinium tosylate, 4,4'-sulfonyldiphenol, and mixtures thereof.

13. The combination of a substrate having a surface and a cured protective layer on said substrate surface, said cured protective layer being formed from a composition comprising a polymer comprising hydroxyalkyl cellulose reacted with an aryl isocyanate.

14. The combination of claim 13, said polymer comprising recurring monomers according to the formula

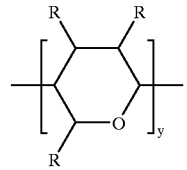

wherein each R is individually selected from the group consisting of —OH, —CH$_2$OH, —O—R$^1$—O—X, and —CH$_2$—O—R$^1$—O—X, with at least one of said R's being —O—R$^1$—O—X or —CH$_2$—O—R$^1$—O—X, and wherein each R$^1$ is individually selected from the group consisting of branched and unbranched alkyl groups, and each X has the formula

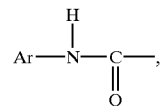

where Ar is an aryl group.

15. The combination of claim 14, wherein at least one R$^1$ is selected from the group consisting of C$_1$-C$_8$ alkyl groups.

16. The combination of claim 15, wherein at least one R$^1$ is selected from the group consisting of ethyl and propyl groups.

17. The combination of claim 14, wherein said polymer comprises from about 41–66% by weight of said monomer, based upon the total weight of the polymer taken as 100% by weight.

18. The combination of claim 13, wherein said aryl isocyanate is selected from the group consisting of C$_6$-C$_{12}$ aryl isocyanates.

19. The combination of claim 18, wherein said aryl isocyanate is selected from the group consisting ofphenyl isocyanates, benzyl isocyanates, and 2-nitrophenyl isocyanates.

20. The combination of claim 13, wherein said layer absorbs at least about 96% of light at a wavelength of 193 nm.

21. A method of forming a precursor structure for use in manufacturing integrated circuits, said method comprising the step of applying a quantity of an anti-reflective composition according to claim 1 to the surface of a substrate to form an anti-reflective layer on said substrate surface.

22. The method of claim 21, wherein said applying step comprises spin-coating said composition on said substrate surface.

23. The method of claim 21, further including the step of baking said anti-reflective layer after said applying step at a temperature of at least about 150° C.

24. The method of claim 23, further including the step of applying a photoresist to said baked anti-reflective layer.

25. The method of claim 24, furthering including the steps of:

exposing at least a portion of said photoresist layer to activating radiation;

developing said exposed photoresist layer; and etching said developed photoresist layer.

26. A method of forming a polymer useful in anti-reflective compositions utilized in microlithographic processes, said method comprising the step of reacting an aryl isocyanate with a hydroxyalkyl cellulose in a solvent system, wherein the solvent system includes PGMEA.

27. A method of forming a polymer useful in anti-reflective compositions utilized in microlithographic processes, said method comprising the steps of:

reacting an aryl isocyanate with a hydroxyalkyl cellulose so that the carbon atom of the C=O group of the isocyanate bonds to an —OH group of the hydroxyalkyl cellulose to yield a urethane linkage therebetween; and reacting a second isocyanate with the urethane linkage.

* * * * *

UNITED STATES PATENT AND TRADEMARK OFFICE
CERTIFICATE OF CORRECTION

PATENT NO.     : 6,576,408 B2
DATED          : June 6, 2003
INVENTOR(S)    : Meador, James D. et al.

It is certified that error appears in the above-identified patent and that said Letters Patent is hereby corrected as shown below:

Column 1,
Line 7, please insert the following:

-- FEDERALLY SPONSORED RESEARCH/DEVELOPMENT PROGRAM
This invention was made with Government support under contract DASG60-00-C-0044 awarded by the United States Army Space and Missile Defense Command. The Government has certain rights in the invention. --

Signed and Sealed this

Twenty-second Day of July, 2003

JAMES E. ROGAN
*Director of the United States Patent and Trademark Office*